United States Patent
Kim et al.

(10) Patent No.: US 10,050,019 B2
(45) Date of Patent: Aug. 14, 2018

(54) METHOD OF MANUFACTURING WAFER LEVEL PACKAGE AND WAFER LEVEL PACKAGE MANUFACTURED THEREBY

(71) Applicant: SK hynix Inc., Icheon-si Gyeonggi-do (KR)

(72) Inventors: Tae Hoon Kim, Icheon-si (KR); Jong Hoon Kim, Suwon-si (KR); Dae Won Kim, Icheon-si (KR); Hyeong Seok Choi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/405,619

(22) Filed: Jan. 13, 2017

(65) Prior Publication Data

US 2017/0373041 A1 Dec. 28, 2017

(30) Foreign Application Priority Data

Jun. 27, 2016 (KR) .................. 10-2016-0080125

(51) Int. Cl.
*H01L 23/48* (2006.01)
*H01L 25/065* (2006.01)
(Continued)

(52) U.S. Cl.
CPC ........ *H01L 25/0657* (2013.01); *H01L 21/561* (2013.01); *H01L 21/565* (2013.01); *H01L 21/568* (2013.01); *H01L 21/76802* (2013.01); *H01L 21/76877* (2013.01); *H01L 23/295* (2013.01); *H01L 23/3114* (2013.01); *H01L 23/3135* (2013.01); *H01L 23/3142* (2013.01); *H01L 23/481* (2013.01); *H01L 24/32* (2013.01); *H01L 24/83* (2013.01); *H01L 25/50* (2013.01); *H01L 2224/32145* (2013.01); *H01L 2225/06548* (2013.01); *H01L 2225/06562* (2013.01); *H01L 2225/06586* (2013.01); *H01L 2924/01029* (2013.01); *H01L 2924/0665* (2013.01);
(Continued)

(58) Field of Classification Search
CPC ............... H01L 25/0657; H01L 23/295; H01L 23/3114; H01L 23/3135; H01L 23/3142; H01L 23/481; H01L 24/32; H01L 25/50; H01L 23/3121
USPC .... 257/686, 777, E21.499, E23.01, E23.011, 257/E25.013
See application file for complete search history.

(56) References Cited

U.S. PATENT DOCUMENTS 5,313,365 A * 5/1994 Pennisi ................ H01L 23/293
                                                        174/521
6,512,184 B1 * 1/2003 Yamada ................... H01R 4/04
                                                        174/259
(Continued)

FOREIGN PATENT DOCUMENTS

KR 20140111523 A 9/2014

*Primary Examiner* — Brook Kebede
(74) *Attorney, Agent, or Firm* — William Park & Associates Ltd.

(57) ABSTRACT

Provided are a wafer level package and a manufacturing method thereof. A reconfigured substrate may be formed by disposing a first semiconductor die on a dummy wafer, and forming a molding layer and a mold covering layer. A second semiconductor die may be stacked on the first semiconductor die and a photosensitive dielectric layer may be formed. Conductive vias penetrating the photosensitive dielectric layer may be plated.

7 Claims, 15 Drawing Sheets

(51) Int. Cl.
- *H01L 21/56* (2006.01)
- *H01L 21/768* (2006.01)
- *H01L 23/29* (2006.01)
- *H01L 23/31* (2006.01)
- *H01L 23/00* (2006.01)
- *H01L 25/00* (2006.01)

(52) U.S. Cl.
CPC ............... *H01L 2924/07025* (2013.01); *H01L 2924/1431* (2013.01); *H01L 2924/1433* (2013.01); *H01L 2924/1436* (2013.01); *H01L 2924/1437* (2013.01); *H01L 2924/1443* (2013.01)

(56) References Cited

U.S. PATENT DOCUMENTS

| | | | |
|---|---|---|---|
| 2005/0274916 A1* | 12/2005 | Shoji | B32B 3/00 250/580 |
| 2008/0274579 A1 | 11/2008 | Yang et al. | |
| 2012/0068292 A1* | 3/2012 | Ikeda | G02B 13/006 257/432 |
| 2013/0147063 A1* | 6/2013 | Park | H01L 21/568 257/777 |
| 2013/0295725 A1* | 11/2013 | Park | H01L 24/19 438/124 |
| 2015/0228591 A1* | 8/2015 | Kim | H01L 24/17 257/692 |
| 2016/0351472 A1* | 12/2016 | Park | H01L 23/481 |

* cited by examiner

METHOD OF MANUFACTURING WAFER LEVEL PACKAGE AND WAFER LEVEL PACKAGE MANUFACTURED THEREBY

CROSS-REFERENCE TO RELATED APPLICATION

The present application claims priority under 35 U.S.C 119(a) to Korean Application No. 10-2016-0080125, filed on Jun. 27, 2016, which is herein incorporated by reference in its entirety.

BACKGROUND

1. Technical Field

Various embodiments of the present disclosure may generally relate to a packaging technology and, more particularly, to a method of manufacturing a fan out wafer level package and a wafer level package manufactured thereby.

2. Related Art

A semiconductor package may be utilized in electronic products such as computers, mobile devices, or data storages. In accordance with the weight reduction and downsizing trend of the electronic products such as smart phones, a semiconductor package has also been required to have a thickness that is thin. Although a size of a semiconductor chip constituting the semiconductor package has been reduced, the number of solder balls and distance between the solder balls of the semiconductor package are fixed. In order to include the solder balls of the semiconductor package having a fixed distance and with a certain number, a fan out package structure has been proposed. For example, a fan out semiconductor package structure in which a semiconductor chip is impregnated in a molding layer to form a reconfigured wafer, and wirings that are extended from the semiconductor chip to the molding layer has been tried.

SUMMARY

According to an embodiment, there may be provided a method of manufacturing a wafer level package. The method may include forming a molding layer covering a first semiconductor die on a dummy wafer, selectively removing an edge portion of the molding layer, forming a mold covering layer covering the molding layer of which the edge portion is removed and forming a reconfigured substrate including the mold covering layer, the molding layer, and the first semiconductor die, removing the dummy wafer to expose the first semiconductor die, stacking a second semiconductor die on the first semiconductor die, forming a first photosensitive dielectric layer covering the second semiconductor die on the reconfigured substrate, forming opening portions penetrating the first photosensitive dielectric layer and exposing portions of the first and second semiconductor dies, respectively, and forming conductive vias filling the opening portions, respectively.

According to an embodiment, there may be provided a wafer level package. The wafer level package may include a molding layer surrounding a surface and a side of a first semiconductor die, a reconfigured substrate including a mold covering layer that covers a surface of the molding layer, a first photosensitive dielectric layer formed on the reconfigured substrate to cover the second semiconductor die, and conductive vias penetrating the first photosensitive dielectric layer and connected to portions of the first and second semiconductor dies, respectively.

According to an embodiment, there may be provided a wafer level package. The wafer level package may include a substrate, semiconductor dies stacked on the substrate to form a stepped shape, an underfill filling a space between portions of the semiconductor dies and the substrate, a photosensitive dielectric layer covering the semiconductor dies, and conductive vias penetrating the first photosensitive dielectric layer and connected to portions of the semiconductor dies.

DETAILED DESCRIPTION

Figure 1:
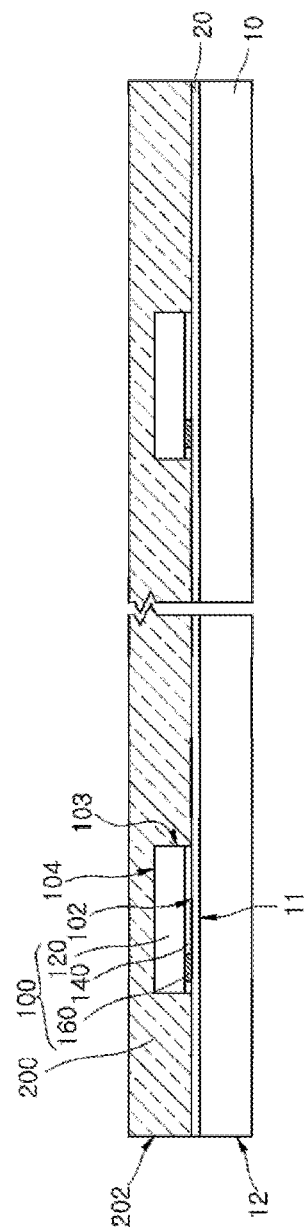
FIGS. 1 to 12 are views illustrating a representation of an example of a fan out wafer level package manufacturing process according to an embodiment.

The terms used in the description of the embodiments correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. In the following description of the embodiments, it will be understood that the terms "first" and "second", "top" and "bottom or lower" are intended to identify the member, but not used to define only the member itself or to mean a particular sequence.

The semiconductor package may include electronic devices such as a semiconductor die or chip, and the semiconductor die or chip may include a cut or processed form of a die or chip from a semiconductor substrate in which electronic circuits are integrated. The semiconductor chip may be a memory chip in which memory integrated circuits such as dynamic random access memory (DRAM) devices, static random access memory (SRAM) devices, flash memory devices, magnetic random access memory (MRAM) devices, resistive random access memory (ReRAM) devices, ferroelectric random access memory (FeRAM) devices or phase changeable random access memory (PcRAM) devices. Alternatively, the semiconductor die or chip may be a logic die or an ASIC chip in which logic circuits are integrated on a semiconductor substrate.

The package substrate is a substrate for electrically connecting the semiconductor chip to other devices of the outside, and the package substrate may include circuit traces in a substrate body of a dielectric material layer unlike the semiconductor substrate. The package substrate may have a form of a printed circuit board (PCB). The semiconductor package may be applied to information communication devices such as mobile devices, bio or health care associated electronic devices, and wearable electronic devices to the human body.

The same reference numerals refer to the same elements throughout the specification. Thus, even though a reference numeral is not mentioned or described with reference to a drawing, the reference numeral may be mentioned or described with reference to another drawing. In addition, even though the reference numerals are not illustrated in a drawing, it may be mentioned or described with reference to another drawing.

Various embodiments may be directed to a method of manufacturing a wafer level package and a wafer level package manufactured thereby.

FIGS. 1 to 12 are views illustrating a representation of an example of a fan out wafer level package manufacturing process according to an embodiment.

Referring to FIG. 1, a separation layer 20 may be formed on a dummy wafer 10. The separation layer 20 may be formed on a surface 11 of the dummy wafer 10. The dummy wafer 10 may have a side edge 12. The dummy wafer 10 may be a silicon wafer. The dummy wafer 10 may be a wafer made of a transparent material, for example, may be a glass wafer. The separation layer 20 may include an adhesive layer that enables other member to be bonded thereon and separated therefrom, for example, may include a temporary adhesive layer.

A plurality of first semiconductor dies 100 may be disposed on the surface 11 of the dummy wafer 10. Each of the first semiconductor dies 100 may be attached to the dummy wafer 10 by the separation layer 20. Each of the first semiconductor dies 100 may be disposed on the dummy wafer 10 such that a first surface 102 of the first semiconductor die 100 faces the surface 11 of the dummy wafer 10, and a second surface 104 opposite to the first surface 102 faces the same direction as a direction that the first surface 11 of the dummy wafer 10 faces.

Each of the first semiconductor dies 100 may include a first device substrate 120, a first device pad 160, and a first passivation layer 140. The first device substrate 120 may include a plurality of unit elements. Each of the unit elements may include, for example, at least one of a memory element, a logic element, or a control element. The first device pad 160 may penetrate the first passivation layer 140 and be electrically connected to at least one of the unit elements. The first passivation layer 140 and the first device pad 160 may be disposed on the first device substrate 120.

A molding layer 200 may be formed on the dummy wafer 10. The molding layer 200 may be formed on the dummy wafer 10 to cover the first semiconductor dies 100. The molding layer 200 may include, for example, epoxy molding compound (EMC). The molding layer 200 may be formed to cover the second surface 104 of each of the first semiconductor dies 100 and a side surface 103 connecting the second surface 104 to the first surface 102, thereby surrounding each of the first semiconductor dies 100. The molding layer 200 may be formed to fill a gap formed between the first semiconductor dies 100. The molding layer 200 may not extend to cover the first surface 102 of the first semiconductor die 100. The molding layer 200 may be molded on the dummy wafer 10 to cover the first semiconductor dies 100, and the first semiconductor dies 100 may be impregnated in the molding layer 200 such that the first surface 102 is exposed from the molding layer 200.

The molding layer 200 may be molded to have substantially the same planar shape as a planar shape of the dummy wafer 10. The molding layer 200 may be molded such that a marginal side edge 202 of the molding layer 200 is arranged to a marginal side edge 12 of the dummy wafer 10. The molding layer 200 may be molded to have substantially the same marginal outline shape as a marginal outline shape of the dummy wafer 10, for example, a wafer shape as viewed on a plane.

Figure 2:
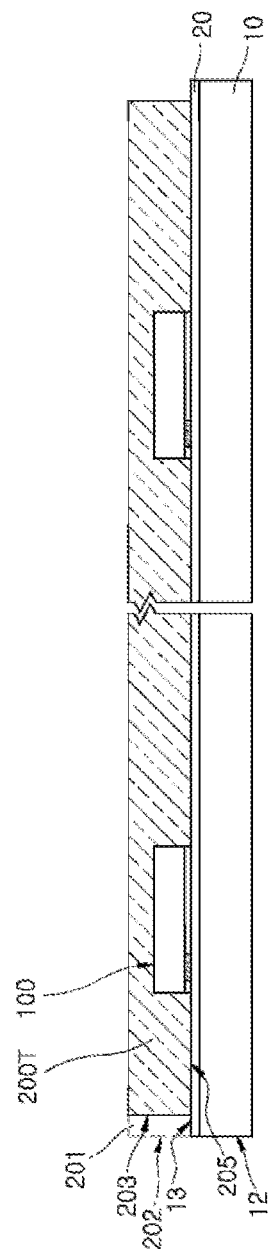

Referring to FIG. 2, marginal edge portions 201 of the molding layer (200 of FIG. 1) may be selectively removed. The edge trimmed molding layer 200T formed by removing the marginal edge portions 201 of the molding layer may expose surface regions 13 of the marginal edge portions of the dummy wafer 10 or the separation layer 20. Side edge 203 of the edge trimmed molding layer 200T formed by removing the marginal edge portions 201 of the molding layer may be drawn back to a position recessed from the initial side edge 202 toward inside of the molding layer 200. The trimmed side edge 203 of the trimmed molding layer 200T and the side edge 12 of the dummy wafer 10 may form a stepped shape.

Figure 3:
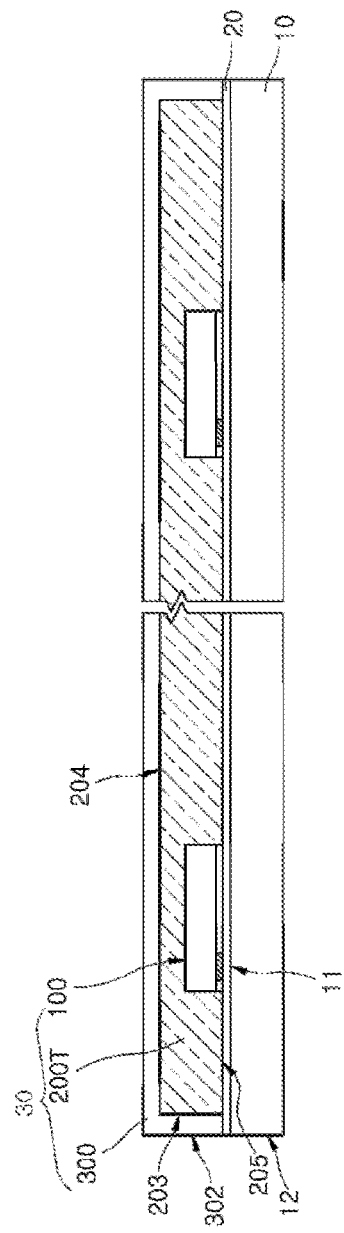

Referring to FIG. 3, a mold covering layer 300 may be formed to cover the edge trimmed molding layer 200T. The mold covering layer 300 may be formed to block the mold layer 200T from an outside. The mold covering layer 300 may be formed to cover the trimmed side edge 203 of the edge trimmed molding layer 200T, and to cover and shield a first surface (for example, an upper surface 204) of the edge trimmed molding layer 200T, the first surface being connected to the trimmed side edge 203. A second surface (for example, a lower surface 205) apposite to the first surface of the edge trimmed molding layer 200T is in contact with the separation layer 20, and may not be directly covered with the mold covering layer 300.

The mold covering layer 300 may be composed of a material different from a material constituting the molding layer 200T. The mold covering layer 300 may include a dielectric material. The mold covering layer 300 may be formed by coating a liquid dielectric material. The mold covering layer 300 may be formed by attaching a film of a dielectric material to the edge trimmed molding layer 200T. The dielectric material may include a polymer material. The dielectric material may include a polyimide (PI) ingredient or an epoxy ingredient. The molding layer 200T may include a filler material such that a molded shape is stably maintained without being deformed. The mold covering layer 300 may be formed of a layer that does not include a filler particle such as a silica filler. By comparison, the molding layer 200T may be formed of a layer including a molding material in which a filler material is distributed in resin such as epoxy.

The first semiconductor dies 100 embedded in the edge trimmed molding layer 200T, the molding layer 200T, and the mold covering layer 300 may constitute a reconfigured substrate 30 structure. An outer side 302 of the mold covering layer 300 may be the outer side of the reconfigured substrate 30. A marginal outline shape of the reconfigured substrate 30 may be substantially the same as the marginal outline shape of the dummy wafer 10, for example, may have a wafer shape as viewed on a plane. The outer side 302 of the mold covering layer 300 and the side edge 12 of the dummy wafer 10 may form an arranged side such that the mold covering layer 300 and the dummy wafer 10 have substantially the same size and shape with each other.

Figure 4:
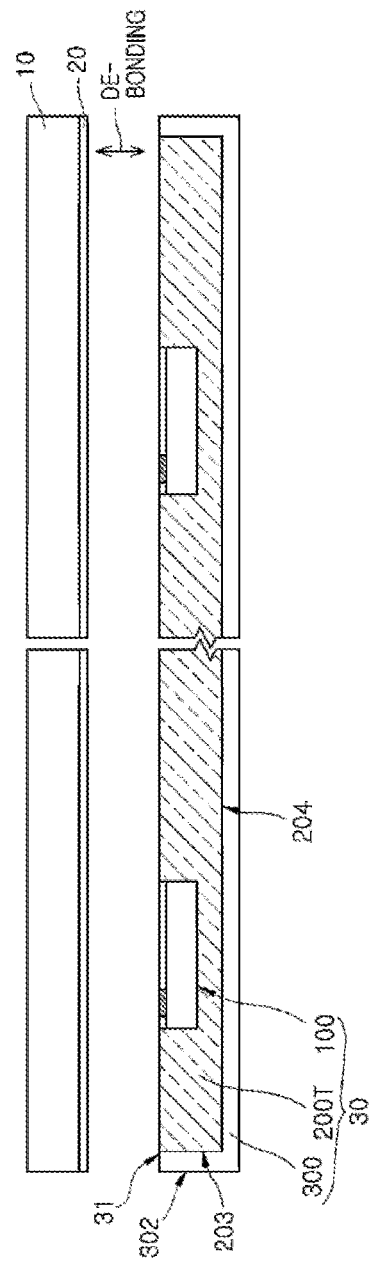

Referring to FIG. 4, the dummy wafer 10 may be separated from the reconfigured substrate 30. The first device pad 160 of each of the first semiconductor dies 100 and the first surface 102 of each of the first semiconductor dies 100 may be exposed to a first surface 31 of the reconfigured substrate 30. The reconfigured substrate 30 may be de-bonded from the dummy wafer 10 by weakening an adhesive strength of the separation layer 20. Since the separation layer 20 includes a temporary adhesive layer, the adhesive strength may be weakened by applying an ultra violet (UV) irradiation or heat to the temporary adhesive layer.

Figure 5:
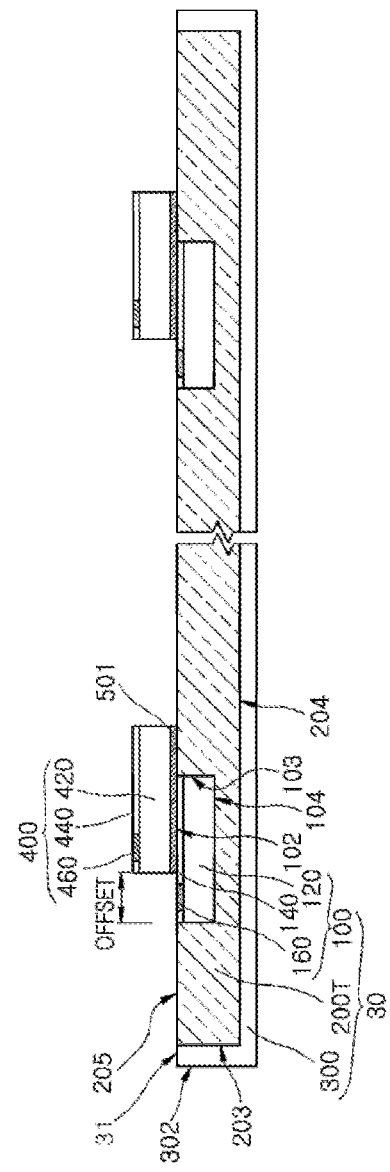

Referring to FIG. 5, second semiconductor dies 400 may be mounted on the first surface 31 of the reconfigured substrate 30. Each of the second semiconductor dies 400 may be stacked on the reconfigured substrate 30 to be in contact with the first surface 102 of each of the first semiconductor dies 100. Each of the second semiconductor dies 400 may be stacked on each corresponding first semiconductor die 100 via a first adhesive layer 501. The first adhesive layer 501 may be formed as a permanent adhesive layer having an adhesive ingredient that substantially permanently attaches the second semiconductor die 400 to the first semiconductor die 100. The first adhesive layer 501 may be a permanent adhesive layer that is maintained in a package without being removed. The first adhesive layer 501 enables the second semiconductor die 400 to be attached to the first surface 102 of the first semiconductor die 100 and to a second surface 205 of the molding layer 200T at the same time.

Each of the second semiconductor dies 400 may be disposed on an offset position, that is, a laterally shifted position with respect to each of the first semiconductor dies 100. Each of the second semiconductor dies 400 may be disposed to expose the first device pad 160 of each of the first semiconductor dies 100, and to be partially overlapped with each of the first semiconductor dies 100. Each of the second semiconductor dies 400 and each of the first semiconductor dies 100 may be stacked in a cascading shape. FIG. 5 illustrates a case that the second semiconductor die 400 and the first semiconductor die 100 are stacked to form a stepped shape. In addition, the second semiconductor die 400 and the first semiconductor die 100 may be intersected and stacked to form a cross shape as viewed on a plane.

Each of the second semiconductor dies 400 may include a second device substrate 420, a second device pad 460, and a second passivation layer 440. The second device substrate 420 may include a plurality of unit elements. Each of the unit elements may include at least a memory element, a logic element, or a control element. The second device pad 460 may penetrate the second passivation layer 440 and be electrically connected to at least one of the unit elements. The second passivation layer 440 and the second device pad 460 may be disposed on the second device substrate 420. The second semiconductor die 400 may be disposed such that the second device pad 460 faces the same direction as a direction that the first device pad 160 of the first semiconductor die 100 faces.

Figure 6:
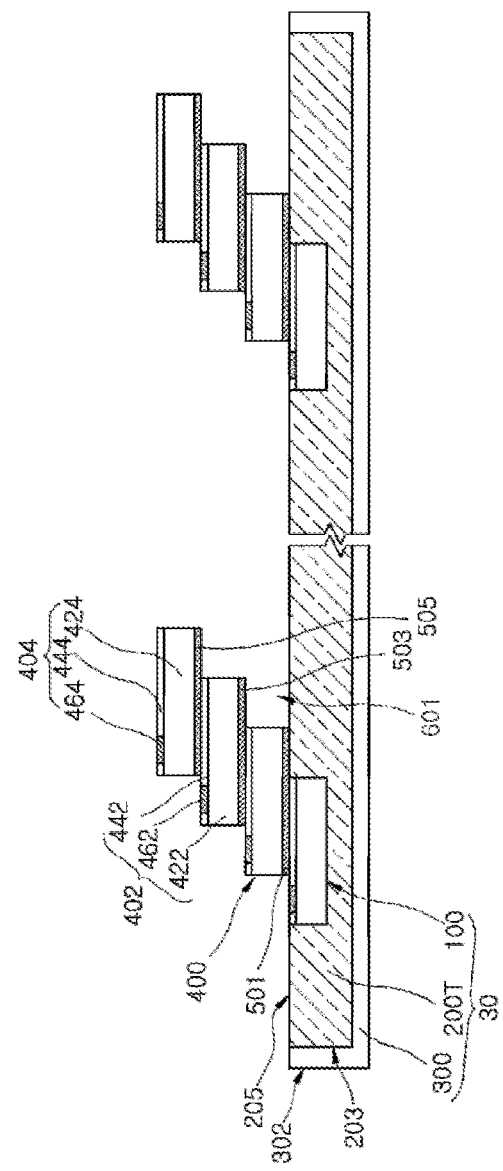

Referring to FIG. 6, each of third semiconductor dies 402 may be stacked on each of the second semiconductor dies 400, respectively. Each of the third semiconductor dies 402 may be stacked on the second semiconductor die 400 using a second adhesive layer 503. Each of fourth semiconductor dies 404 may be stacked on each of the third semiconductor dies 402 using a third adhesive layer 505. The second adhesive layer 503 may substantially permanently attach the third semiconductor dies 402 to the second semiconductor dies 400, and the third adhesive layer 505 may substantially permanently attach the fourth semiconductor dies 404 to the third semiconductor dies 402.

Each of the third semiconductor dies 402 may be located on an offset position with respect to each of the second semiconductor dies 400. That is, the third semiconductor die 402 may be located on a laterally shifted position from the second semiconductor die 400. Each of the fourth semiconductor dies 404 may be located on an offset position with respect to each of the third semiconductor dies 402. That is, the fourth semiconductor die 404 may be located on a laterally shifted position from the third semiconductor die 402. The first to fourth semiconductor dies 100, 400, 402 and 404 may be continuously stacked to be off-set and to form a stepped shape or a cascading shape.

The third semiconductor die 402 may be disposed to expose the second device pad 460 of the second semiconductor die 400, and to be partially overlapped with the second semiconductor die 400. Each of the third semiconductor dies 402 may include a third device substrate 422, a third device pad 462, and a third passivation layer 442. Each of the fourth semiconductor dies 404 may include a fourth device substrate 424, a fourth device pad 464, and a fourth passivation layer 444.

Each of the third device substrates 422 and each of the fourth device substrates 424 may include a plurality of unit elements. Each of the unit elements may include, for example, at least a memory element, a logic element or a control element. The third device pad 462 and the fourth device pad 464 may penetrate the third passivation layer 442 and the fourth passivation layer 444, respectively, and be electrically connected to at least a unit element, respectively.

The third passivation layer 442 and the third device pad 462 may be disposed on the third device substrate 422. The fourth passivation layer 444 and the fourth device pad 464 may be disposed on the fourth device substrate 424. The third semiconductor die 402 may be disposed such that the third device pad 462 faces the same direction as a direction that the first device pad 160 of the first semiconductor die 100 faces. The fourth semiconductor die 404 may be disposed such that the fourth device pad 464 faces the same direction as a direction that the first device pad 160 of the first semiconductor die 100 faces. The fourth semiconductor die 404 may be stacked on the third semiconductor die 420 to expose the third device pad 462. Additional semiconductor dies may be further stacked on the fourth semiconductor die 404.

Referring to FIG. 6, there may be a space 601 between laterally protruded portions of the third semiconductor die 402 and the fourth semiconductor die 404, and the second surface 205 of the molding layer 200T.

Figure 7:
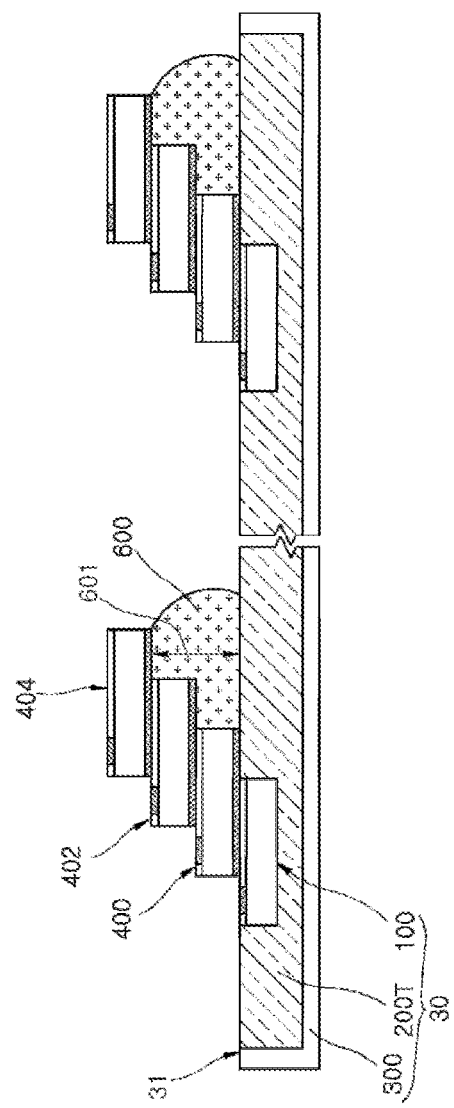

Referring to FIG. 7, an underfill 600 may be formed to fill the space 601 between the laterally protruded portions of the third semiconductor die 402 and the fourth semiconductor die 404, and the second surface 205 of the molding layer 200T. The underfill 600 may be formed by jetting a dielectric material, an epoxy material or a polymeric material.

Figure 8:
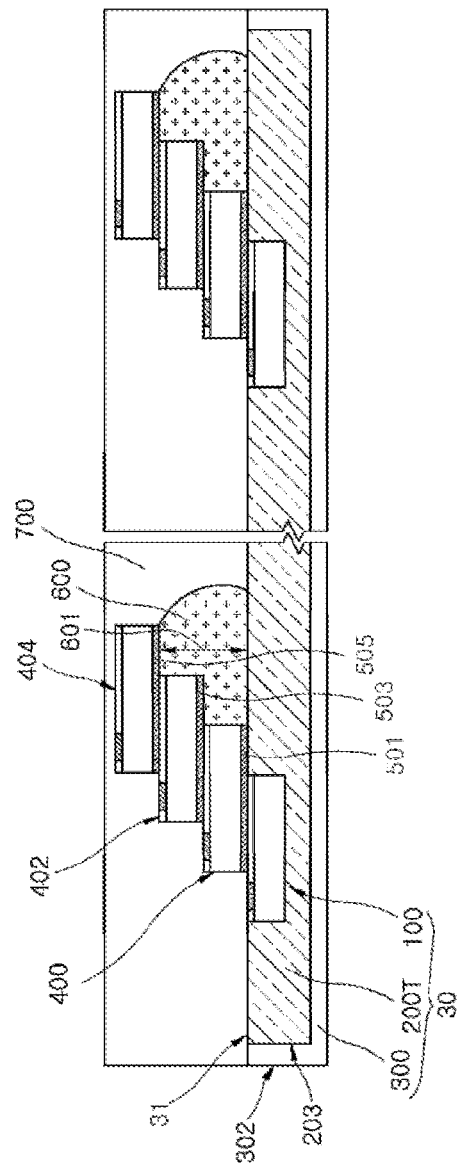

Referring to FIG. 8, a first photosensitive dielectric layer 700 that covers and buries the second to fourth semiconductor dies 400, 402 and 404 may be formed on the reconfigured substrate 30. Since the space 601 between the laterally protruded portions of the semiconductor die 402 and the fourth semiconductor die 404 and the second surface 205 of the molding layer 200T is filled with the underfill 600 in advance, the first photosensitive dielectric layer 700 may be formed to be in contact with the underfill 600. Since the underfill 600 fills the space 601, the first photosensitive dielectric layer 700 does not have to penetrate into the space 601, thereby preventing a void failure that the space 601 is not filled.

The first photosensitive dielectric layer 700 may be provided as an insulation layer. The first photosensitive dielectric layer 700 may be formed by laminating or coating a photosensitive polymer material such as photosensitive polyimide (PI) or photosensitive polybenzoxazole on the reconfigured substrate 30. Since the first photosensitive dielectric layer 700 contains a photosensitizer, a property of the first photosensitive dielectric layer 700 may be changed such that a solubility of a portion exposed by a light source such as ultraviolet (UV) rays becomes different from a solubility of an unexposed portion. The first photosensitive dielectric layer 700 may be formed to have a flat surface as a whole.

The second to fourth semiconductor dies 400, 402 and 404 may be maintained in an attached and fixed state by the first to third adhesive layers 501, 503 and 505, when the second to fourth semiconductor dies 400, 402 and 404 are covered and buried by the first photosensitive dielectric layer 700. Since the second to fourth semiconductor dies 400, 402 and 404 are fixed by the first to third adhesive layers 501, 503 and 505 that have a permanent adhesive strength, a phenomenon that positions of the semiconductor dies vary can be effectively prevented when the first photosensitive dielectric layer 700 is formed.

Figure 9:
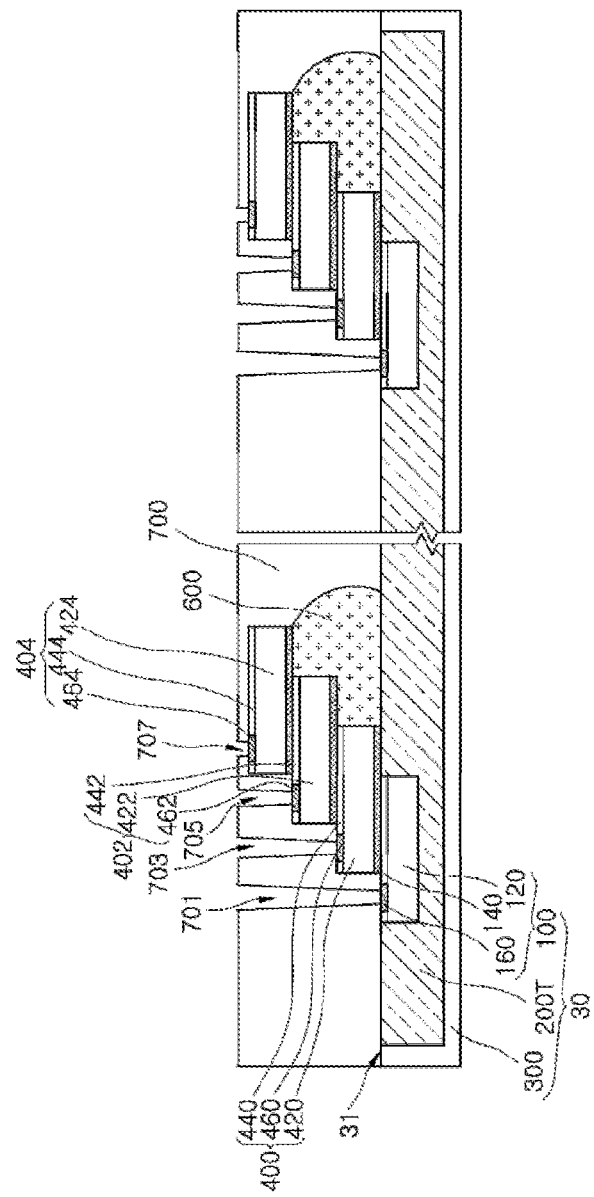

Referring to FIG. 9, first opening portions 701, 703, 705 and 707 may be formed in the first photosensitive dielectric layer 700, the first opening portions 701, 703, 705 and 707 exposing a portion of a surface of the semiconductor dies 100, 400, 402 and 404, that is, the device pads 160, 460, 462 and 464. Each of the first opening portions 701, 703, 705 and 707 may be formed as a substantially vertical hole that penetrates the first photosensitive dielectric layer 700 and is aligned to each of the device pads 160, 460, 462 and 464, respectively. A first opening portion first hole 701 may be formed as a hole exposing the first device pad 160 of the first semiconductor die 100. A first opening portion second hole 703 may be formed as a hole exposing the second device pad 460 of the second semiconductor die 400. A first opening portion third hole 705 may be formed as a hole exposing the third device pad 462 of the third semiconductor die 462. A first opening portion fourth hole 707 may be formed as a hole exposing the fourth device pad 464 of the fourth semiconductor die 404.

The first opening portions 701, 703, 705 and 707 may be formed by directly exposing some portions of the first photosensitive dielectric layer 700 to a light source such as UV rays and developing the first photosensitive dielectric layer 700. Since a photolithography process can be directly applied to the first photosensitive dielectric layer 700, forming an additional photoresist material for patterning the first photosensitive dielectric layer 700 can be omitted. In addition, since the reconfigured substrate 30 has a wafer shape such as a silicon wafer, the first opening portions 701, 703, 705 and 707 can be formed using an apparatus for processing the silicon wafer, for example, a silicon wafer processing apparatus. Accordingly, each of the first opening portions 701, 703, 705 and 707 can be patterned as a hole having a finer diameter.

Figure 10:
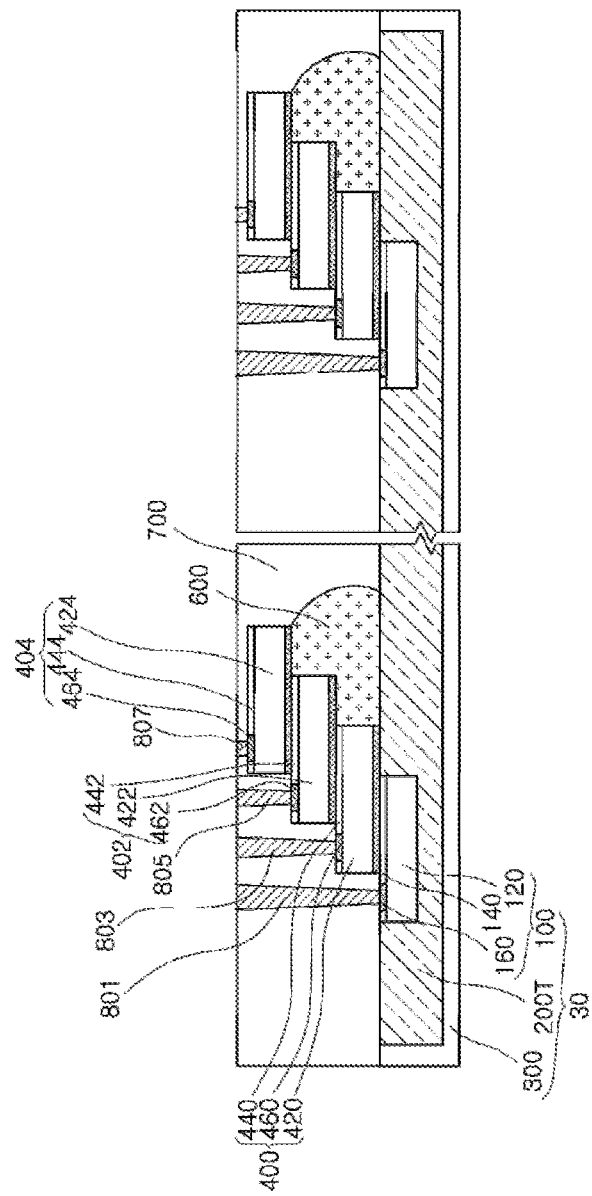

Referring to FIG. 10, conductive vias 801, 803, 805 and 807 may be formed to fill each of the first opening portions 701, 703, 705 and 707. Each of the conductive vias 801, 803, 805 and 807 may be formed to include a variety of conductive materials. Each of the conductive vias 801, 803, 805 and 807 may be formed to include a layer of a metal material such as copper (Cu) having a high conductivity.

The conductive vias 801, 803, 805 and 807 may be formed using a plating process. The plating process may be performed by inserting a resultant having the first opening portions 701, 703, 705 and 707 formed therein into a plating bath containing a plating solution, and the conductive vias 801, 803, 805 and 807 may be plated. At this time, since the molding layer 200T is covered with the mold cover layer 300 and the first photosensitive dielectric layer 700 and shielded from the plating solution, the plating solution can be effectively prevented from being contaminated by contaminants that may be contained in the molding layer 200T. An epoxy molding compound (EMC) material constituting the molding layer 200T may contain fillers. The filler may contaminate the plating solution. For example, a silica particle used as the filler may contaminate the plating solution. Since the molding layer 200T is sealed by the mold covering layer 300 and the first photosensitive dielectric layer 700, the contamination of the solution caused by the particles can be fundamentally prevented. Since the mold covering layer 300 does not contain the filler, the contamination of the plating solution by the filler can be prevented.

The first conductive via 801 may be formed as a vertical connector connected to the first device pad 160 of the first semiconductor die 100. The second conductive via 803 may be formed as a vertical connector connected to the second device pad 460 of the second semiconductor die 400. The third conductive via 805 may be formed as a vertical connector connected to the third device pad 462 of the third semiconductor die 402. The fourth conductive via 807 may be formed as a vertical connector connected to the fourth device pad 464 of the fourth semiconductor die 404.

Figure 11:
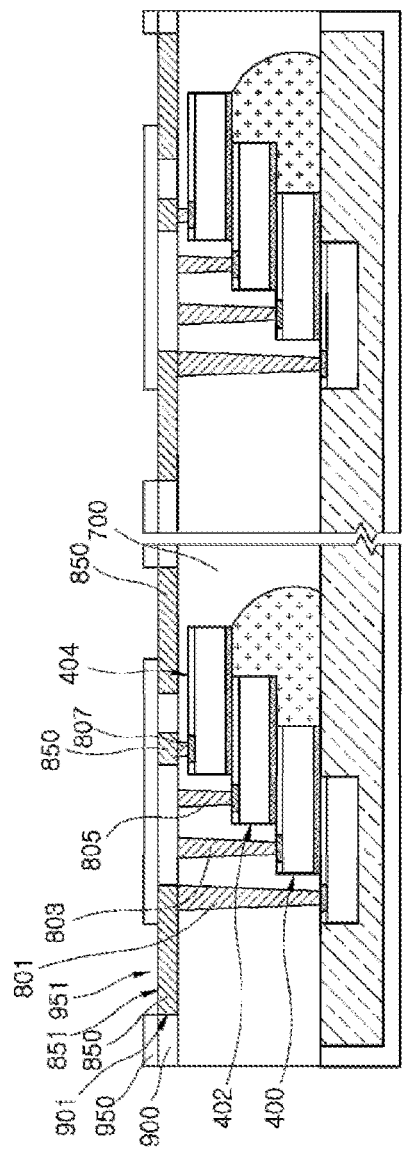

Referring to FIG. 11, a second photosensitive dielectric layer 900 may be formed on the first photosensitive dielectric layer 700. The second photosensitive dielectric layer 900 may be formed on the first photosensitive dielectric layer 700 having the conductive vias 801, 803, 805 and 807 formed therein. The second photosensitive dielectric layer 900 may be provided as an insulation layer having a thickness that is different from, for example, thinner than a thickness of the first photosensitive dielectric layer 700. The second photosensitive dielectric layer 900 may be formed by laminating or coating a photosensitive polymer material such as photosensitive polyimide (PI) or photosensitive polybenzoxazole on the first photosensitive dielectric layer 700. Since the second photosensitive dielectric layer 900 contains a photosensitizer, a property of the second photosensitive dielectric layer 900 may be changed such that a solubility of a portion exposed by a light source such as ultraviolet (UV) rays becomes different from a solubility of an unexposed portion.

A plurality of second opening portions 901 may be formed by directly exposing portions of the second photosensitive dielectric layer 900 to a light source such as UV rays, and developing the second photosensitive dielectric layer 900. Each of the second opening portions 901 may be formed in a concave shape for redistribution layer (RDL) patterns connected to the conductive vias 801, 803, 805 and 807, respectively.

RDL patterns 850 may be formed by filling the second opening portions 901 with a conductive material. Each of the RDL patterns 850 may be formed to include a variety of conductive materials. Each of the RDL patterns 850 may be formed to include a layer of a metal material such as copper (Cu) having a high conductivity. The RDL patterns 850 may be formed using a plating process. The plating process may be performed by inserting a resultant having the second opening portions 901 formed therein into a plating bath containing a plating solution, and the RDL patterns 850 may be plated. At this time, since the molding layer 200T portion is covered with the mold cover layer 300 and the first and second photosensitive dielectric layers 700 and 900 and shielded from the plating solution, the plating solution can be effectively prevented from being contaminated by contaminants that may be contained in the molding layer 200T.

A third photosensitive dielectric layer 950 may be formed to cover the RDL patterns 850 and the second photosensitive dielectric layer 900. The third photosensitive dielectric layer 950 may be formed by laminating or coating a layer of a polymer material containing a photosensitive ingredient. Third opening portions 951 may be formed by directly exposing portions of the third photosensitive dielectric layer 950 to a light source such as UV rays and developing the third photosensitive dielectric layer 950. Each of the third opening portions 951 may be formed to expose some portions of the RDL patterns 850 to provide connecting portions 851.

Figure 12:
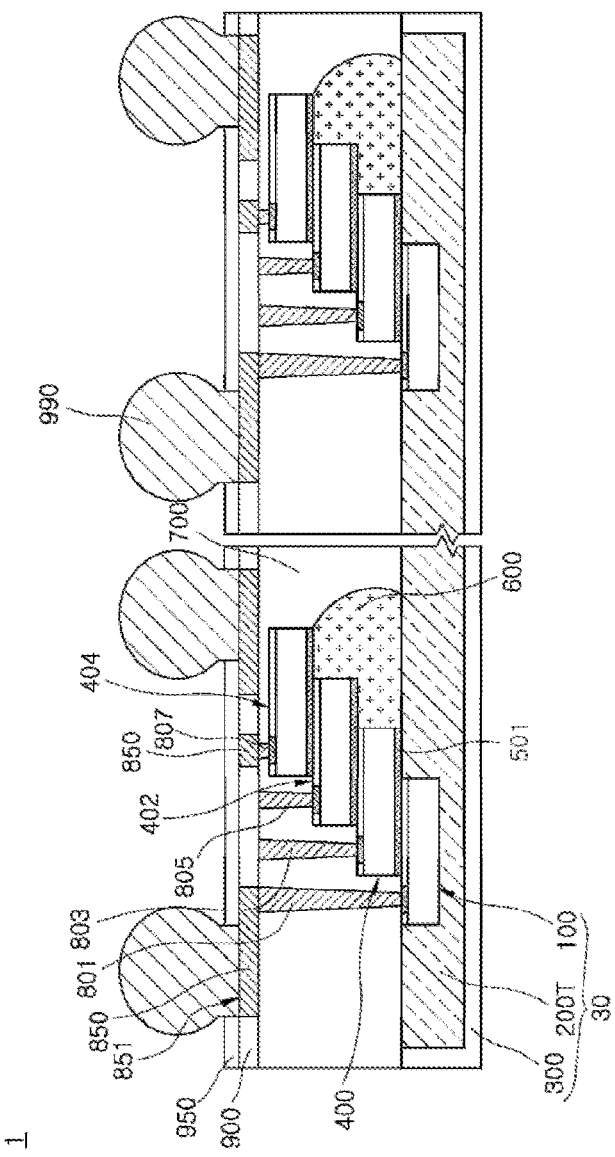

Referring to FIG. 12, outer connectors 990 may be formed in the connecting portions 851 of the RDL patterns 850, the connecting portions 851 being exposed by the third photosensitive dielectric layer 950. Each of the outer connectors 990 such as a solder ball may be attached to each of the exposed connecting portions 851 of the RDL pattern 850. The resultant package structure 1 having the outer connectors 990 attached thereto may have a structure that the first semiconductor die 100 is buried in the reconfigured substrate 30, the second semiconductor die 400 is stacked on the reconfigured substrate 30 while forming a stepped shape with the first semiconductor die 100, and the third semiconductor die 402 and the fourth semiconductor die 404 are sequentially stacked on the second semiconductor die 400 while forming a stepped shape.

An underfill 600 may be formed to fill a space between portions of the third and fourth semiconductor dies 402 and 404 and the reconfigured substrate 30, and the first adhesive layer 501 may permanently attach the second semiconductor die 400 to the first semiconductor die 100 and the molding layer 200T at the same time. The molding layer 200T may include a resin containing fillers distributed therein, and the mold covering layer 300 may include a dielectric material layer that does not contain the filler.

Figure 13:
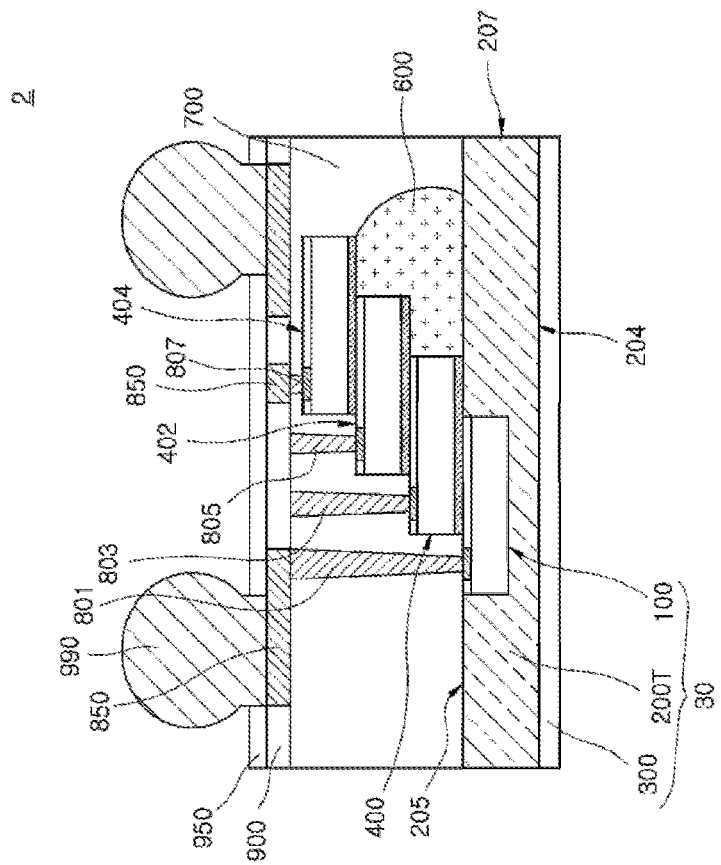
FIG. 13 is a view illustrating a representation of an example of a wafer level package according to an embodiment.

FIG. 13 is a view illustrating a representation of an example of a wafer level package 2 according to an embodiment.

Referring to FIG. 13, a package structure, as described with reference to FIGS. 1 to 12, may be singulated and separated into individual package structures 2. The package structure 2 may include a first photosensitive dielectric layer 700 burying a third semiconductor die 402 and a fourth semiconductor die 404 on a second semiconductor die 400, and conductive vias 801, 803, 805 and 807 penetrating the first photosensitive dielectric layer 700 and connected to the first to fourth semiconductor dies 100, 400, 402 and 404, respectively.

The package structure 2 may include a second photosensitive dielectric layer 900 and a third photosensitive dielectric layer 950 that are stacked on the first photosensitive dielectric layer 700, and include RDL patterns 850 surrounded by the second photosensitive dielectric layer 900. The package structure 2 may include outer connectors 990 substantially penetrating the third photosensitive layer 950 and connected to the RDL patterns 850.

The reconfigured substrate 30 constituting the package structure 2 may include a molding layer 200T burying the first semiconductor die 100, and a mold covering layer 300 covering at least a portion of a surface of the molding layer 200T. The mold covering layer 300 may be formed to cover a surface, for example, a first surface 204 of the molding layer 200T. The mold covering layer 300 may not extend to a cut side surface 207 of the molding layer 200T, which is exposed by being separated into the individual package structures 2, and the cut side 207 of the molding layer 200T may be exposed by the mold covering layer 300.

Referring to FIG. 13, though a case that the reconfigured substrate 30 includes the first semiconductor die 100 is used as an example, a package structure in which the first semiconductor die 100 is omitted, the second to fourth semiconductor dies 400, 420 and 404 are stacked on a substrate while forming a stepped shape, and an underfill 600 filling a space between portions of the third and fourth semiconductor dies 402 and 404 and the substrate can be implemented.

Figure 14:
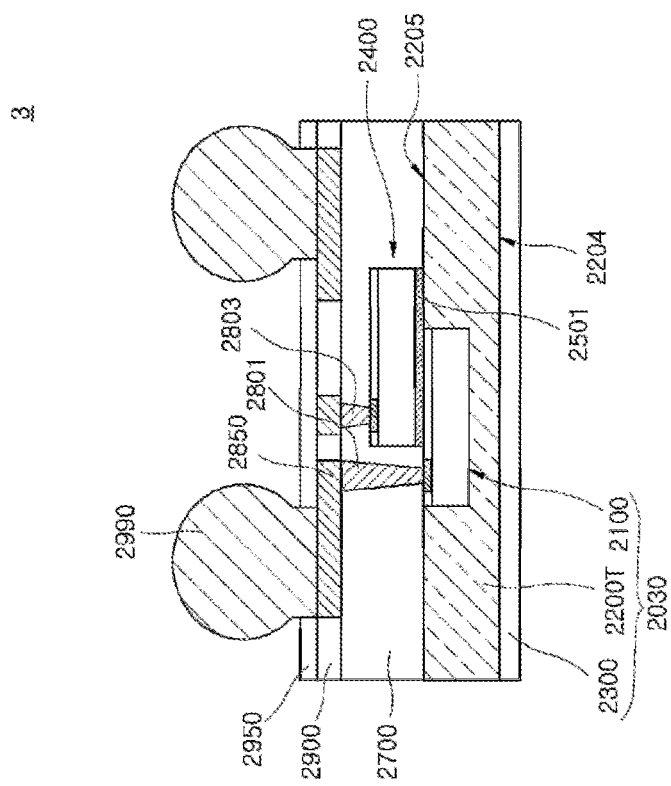
FIG. 14 is a view illustrating a representation of an example of a wafer level package according to an embodiment.

FIG. 14 is a view illustrating a representation of an example of a wafer level package 3 according to an embodiment.

Referring to FIG. 14, the wafer level package 3 may include a molding layer 2200T surrounding a surface and side of a first semiconductor die 2100, and a reconfigured substrate 2030 including a mold covering layer 2300 covering a surface 2204 of the molding layer 2200T. The mold covering layer 2300 may include a different material from the molding layer 2200T. The molding layer 2200T may include a resin material containing a filler material, for example, epoxy molding compound (EMC). The mold covering layer 2300 may include a layer of a dielectric material that does not contain a filler material. A second semiconductor die 2400 may be stacked on the first semiconductor die 2100 to form a stepped shape. The second semiconductor die 2400 may be attached to the first semiconductor die 2100 by a permanent adhesive layer 2501 and may be attached to another surface 2205 of the molding layer 2200T at the same time.

A first photosensitive dielectric layer 2700 may be formed on the reconfigured substrate 2030 to cover the second semiconductor die 2400, and a first conductive via 2801 penetrating the first photosensitive dielectric layer 2700 and connected to the first semiconductor die 2100 may be disposed. A second conductive via 2803 may be disposed to substantially penetrate the first photosensitive dielectric layer 2700 and to be connected to the second semiconductor die 2400. A second photosensitive dielectric layer 2900 may be disposed on the first photosensitive dielectric layer 2700, and redistribution layer (RDL) patterns 2850 separated into patterns by the second photosensitive dielectric layer 2900 may be disposed to be connected to the first and second conductive vias 2801 and 2803, respectively. A third photosensitive dielectric layer 2950 may be disposed on the second photosensitive dielectric layer 2900, and outer connectors 2990 may be disposed to substantially penetrate the third photosensitive dielectric layer 2950 and to be connected to the RDL patterns 2850, respectively.

Figure 15:
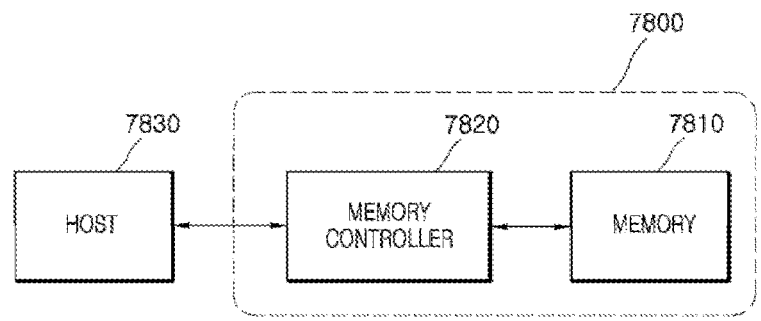
FIG. 15 is a block diagram illustrating a representation of an example of an electronic system employing a memory card including a package according to an embodiment.

FIG. 15 is a block diagram illustrating a representation of an example of an electronic system including a memory card 7800 including at least one semiconductor package according to an embodiment. The memory card 7800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in an embedded package according to an embodiment.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 16:
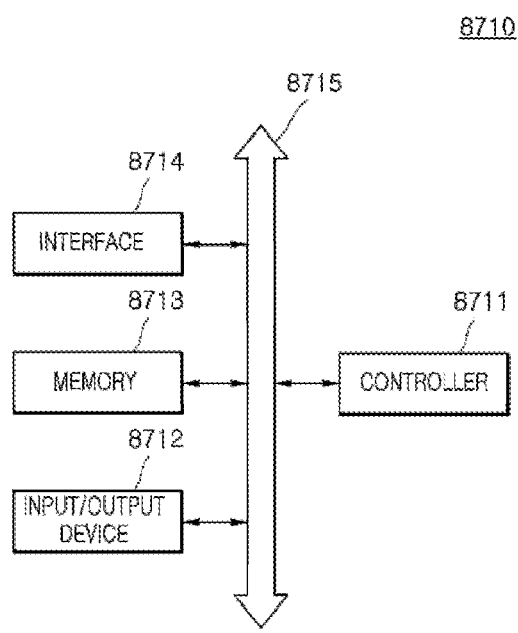
FIG. 16 is a block diagram illustrating a representation of an example of an electronic system including a package according to an embodiment.

FIG. 16 is a block diagram illustrating a representation of an example of an electronic system 8710 including at least one package according to an embodiment. The electronic system 8710 may include a controller 8711, an input/output device 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A wafer level package comprising:
  a molding layer surrounding a surface and a side of a first semiconductor die, the molding layer having a first surface and a second surface;
  a mold covering layer that covers the second surface of the molding layer, the mold covering layer formed of different material from the molding layer;
  a second semiconductor die attached to the first semiconductor die and to the first surface of the molding layer;
  a third semiconductor die and a fourth semiconductor die stacked on the second semiconductor die forming a stepped shape;
  an underfill filling a space between laterally protruded portions of the third and fourth semiconductor dies and the first surface of the molding layer, the underfill formed of different material from the molding layer;
  a first photosensitive dielectric layer formed on the first surface of the molding layer to cover the second semiconductor die; and
  conductive vias penetrating the first photosensitive dielectric layer and connected to portions of the first and second semiconductor dies, respectively.

2. The wafer level package of claim 1, wherein the first semiconductor die comprises:
  a first device substrate;
  a first passivation layer disposed on the first device substrate; and
  a first device pad penetrating the first passivation layer and exposed by the first passivation layer, the first device pad being connected to the first device substrate.

3. The wafer level package of claim 2, wherein the second semiconductor die is disposed on the first semiconductor die, the first device pad being exposed by the second semiconductor die.

4. The wafer level package of claim 3, wherein the second semiconductor die comprises:
  a second device substrate;
  a second passivation layer disposed on the second device substrate; and
  a second device pad penetrating the second passivation layer and exposed by the second passivation layer, the second device pad being connected to the second device substrate,
  wherein the second semiconductor die is disposed on the first semiconductor die such that the second device pad faces the same direction as a direction that the first device pad faces.

5. The wafer level package of claim 1, wherein the second semiconductor die is substantially simultaneously attached to the first semiconductor die and the molding layer by a permanent adhesive layer.

6. The wafer level package of claim 1, further comprises:
  a second photosensitive dielectric layer disposed on the first photosensitive dielectric layer; and
  redistribution layer patterns connected to the conductive vias, respectively.

7. The wafer level package of claim 1,
  wherein the molding layer includes a resin containing fillers distributed therein, and
  wherein the mold covering layer includes a dielectric material layer excluding the fillers.

* * * * *